(12) United States Patent
Joe

(10) Patent No.: US 6,259,390 B1
(45) Date of Patent: Jul. 10, 2001

(54) METHOD AND APPARATUS FOR GENERATING PULSES FROM ANALOG WAVEFORMS

(75) Inventor: Jurianto Joe, Singapore (SG)

(73) Assignee: National University of Singapore (SG)

( * ) Notice: Subject to any disclaimer, the term of this patent is extended or adjusted under 35 U.S.C. 154(b) by 0 days.

(21) Appl. No.: 09/429,527

(22) Filed: Oct. 28, 1999

(51) Int. Cl.$^7$ ................................................ H03M 1/00
(52) U.S. Cl. .......................................... 341/133; 341/111
(58) Field of Search ................................ 341/133, 111; 318/798; 330/284; 327/514; 331/74

(56) References Cited

U.S. PATENT DOCUMENTS

| | | |
|---|---|---|
| 3,312,911 | 4/1967 | De Boer . |
| 3,967,210 | 6/1976 | Aumann ................................. 331/56 |
| 4,028,562 | 6/1977 | Zuleeg ................................. 307/303 |
| 4,037,252 * | 7/1977 | Jansen ................................. 358/128 |
| 4,365,212 | 12/1982 | Gentile et al. ....................... 331/111 |
| 4,560,949 * | 12/1985 | Young ................................. 330/284 |
| 4,599,549 * | 7/1986 | Mutoh et al. ....................... 318/798 |
| 5,012,244 * | 4/1991 | Wellard et al. ..................... 341/143 |
| 5,107,264 | 4/1992 | Novof ................................. 341/101 |
| 5,170,274 * | 12/1992 | Kuwata et al. ....................... 359/182 |
| 5,339,053 | 8/1994 | Lux et al. ............................. 331/99 |
| 5,777,507 * | 7/1998 | Kaminishi et al. .................. 327/514 |

FOREIGN PATENT DOCUMENTS 1 438 262   7/1966   (FR) .

OTHER PUBLICATIONS

Abel, E., "Gated Oscillator Emulates a Flip–Flop", EDN Access, pp. 1–2, Mar. 16, 1995.
Gallerani, A., "Oscillator Meets Three Requirements", EDN Access, pp. 119–120, Dec. 3, 1998.
Peter Konig, *Image Segmentation Based on Oscillatory Correlation,* Neural Computation 9, 1997, pp. 805–836.
James P. Keener, *Analog Circuitry for the van der Pol and FitzHugh—Nagumo Equations,* IEEE 1983, pp. 1011–1015.

* cited by examiner

*Primary Examiner*—Peguy JeanPierre
(74) *Attorney, Agent, or Firm*—Townsend and Townsend and Crew LLP; Kenneth R. Allen; George B. F. Yee

(57) ABSTRACT

A method and apparatus are provided for generating output pulses or oscillations in response to input analog waveforms which involves exciting, with a known but arbitrary analog waveform, a circuit with a variable operating point and having a transfer function characterized by an unstable operating region bounded by a first stable operating region and a second stable operating region. The analog waveform is characterized by having a first information region and a second information region. In response to sensing the first and second information regions, the operating point of the circuit is forced into its unstable and stable regions. This produces a sequence of oscillatory and non-oscillatory behavior at the circuit's output.

18 Claims, 7 Drawing Sheets

METHOD AND APPARATUS FOR GENERATING PULSES FROM ANALOG WAVEFORMS

BACKGROUND OF THE INVENTION

This invention relates to a waveform to pulse conversion technique and more particularly to techniques for converting arbitrary analog waveforms to sequences of pulses.

Pulse generators are well known, for example, for DC controllers and other applications. However, the typical pulse generator is an adaptation of a conventional oscillator or monostable multivibrator, which can produce undesired or spurious transients when the pulse triggering is terminated. Such transients could be confused with trailing pulses, so that the counting of pulses is an inaccurate representation of the intended pulse count.

A typical pulse generator is responsive to a trigger related to a threshold level; that is, pulses are generated when a level input is applied that exceeds a predetermined threshold that has established a trigger point. The duration of the input above the threshold typically corresponds to the duration of the pulse train or oscillation period.

A classic van der Pol (vdP) oscillator is a simple nonlinear oscillator circuit and is a useful starting point for use as a pulse generator. However, the classic vdP oscillator is not readily tunable.

Circuitry is needed which is simple and yet which addresses needs in specialized applications.

SUMMARY OF THE INVENTION

According to the invention, a method and apparatus are provided for generating output pulses or oscillations in response to input analog waveforms which involves exciting, with a known but arbitrary analog waveform, a circuit with a variable operating point and having a transfer function characterized by an unstable operating region bounded by a first stable operating region and a second stable operating region, the analog waveform having a first information region and a second information region, then, responsive to the sensing of the first information region, forcing the variable operating point to vary in order to initiate operation of the circuit in the unstable operating region to produce a sequence of oscillations at a frequency greater than rate of change of the operating point; and then responsive to the sensing of the second information region, forcing the variable operating point to vary into either one of the stable operating regions in order to terminate the oscillations, such that the initiating and terminating of oscillations alternate. The result is a mapping of each cycle of the input waveforms to a sequence of pulses separated by silences. The circuit or device according to the invention is a form of oscillator having an N-shaped or S-shaped V-I characteristic that operates nonlinearly; that is, to oscillate during excursion of current and voltage through a unstable operating region. A variety of input waveforms may map to a particular string of pulses. Decoding is not for the purpose of identifying the type of input waveforms. One application is expressing information represented by the waveforms. For example, a character set could be mapped to one or more cyclical waveforms.

The invention will be better understood by reference to the following detailed description in connection with the accompanying drawings.

DESCRIPTION OF THE SPECIFIC EMBODIMENTS

Figure 1A:
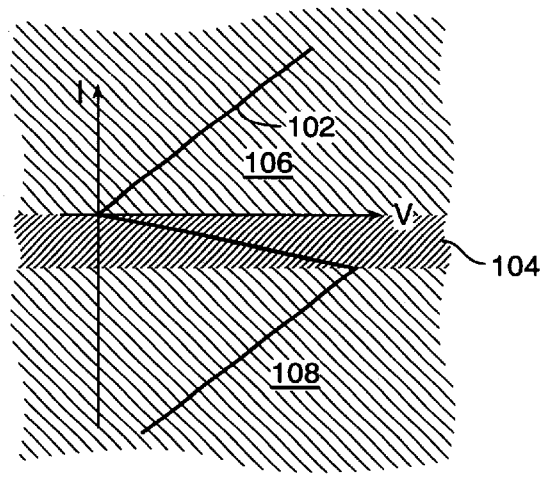
FIGS. 1A and 1B show two types of transfer functions contemplated by the invention.
Figure 1B:
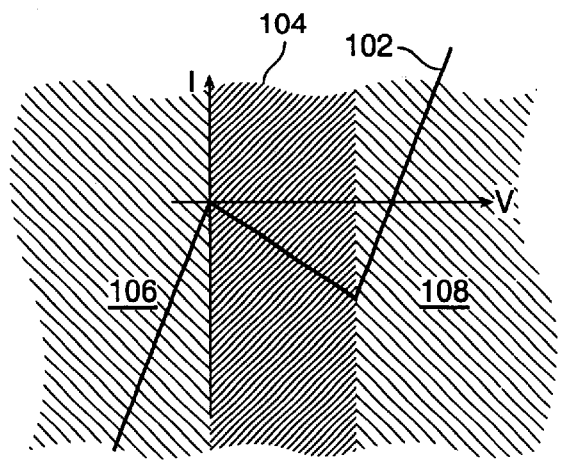

Referring to FIGS. 1A and 1B, circuits contemplated by the present invention exhibit a transfer function having either an S-shaped appearance such as shown in FIG. 1A or the N-shaped appearance shown in FIG. 1B. For the purposes of the present invention, the "transfer function" of a circuit refers to the relationship between any two state variables of a circuit. For example, electronic circuits are typically characterized by their I-V curves, relating the two state variables of current and voltage. Such curves indicate how one state variable (e.g., current) changes as the other state variable (voltage) varies. As can be seen in FIGS. 1A and 1B, each transfer function 102 includes a portion which lies within a region 104, referred to herein as an "unstable" region. The unstable region is bounded on either side by regions 106 and 108, each of which is herein referred to as the "stable" region.

A circuit in accordance with the invention has an associated "operating point" which is defined as its location on the transfer function 102. The nature of the output of the circuit depends on the location of its operating point. If the operating point is positioned along the portion of the transfer function that lies within region 104, the output of the circuit will exhibit an oscillatory behavior. Hence, the region 104 in which this portion of the transfer function is found is referred to as an unstable region. If the operating point is positioned along the portions of the transfer function that lie within either of regions 106 and 108, the output of the circuit will exhibit a generally time-varying but otherwise non-oscillatory behavior. For this reason, regions 106 and 108 are referred to as stable regions.

Figure 2:
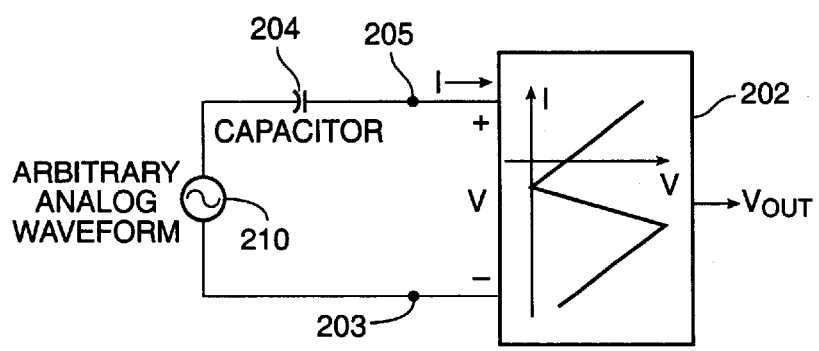
FIGS. 2 and 3 show circuit arrangements for forcing the operating point between stable and unstable regions of operation.

Referring to FIG. 2, a configuration for varying the operating point of a circuit is shown. The figure shows a circuit 202 having inputs 203 and 205. A capacitive element 204 is coupled at one end to an input 205. An arbitrary analog waveform source 210 is coupled between an input 203 and the other end of capacitive element 204, thus completing the circuit. For the purpose of the discussion, circuit 202 has a transfer function which appears S-shaped. The circuit arrangement shown in FIG. 2 allows the slope of the arbitrary waveform generator 210 to move the operating point of circuit 202 into and out of the unstable region 104. This action controls the onset of oscillatory behavior, and cessation of such oscillatory behavior, at the output of circuit 202 as a function of the output of arbitrary waveform generator 210.

Figure 3:
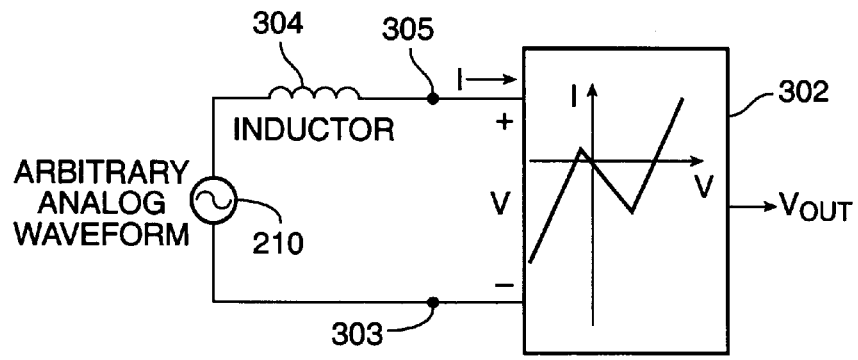

Referring to FIG. 3, an alternative configuration for varying the operating point of a circuit is shown. In this case, the circuit 302 has an N-shaped transfer function. In place of the capacitive element, an inductive element 304 is provided. As with FIG. 2, an arbitrary analog waveform source 210 completes the circuit.

Figure 4:
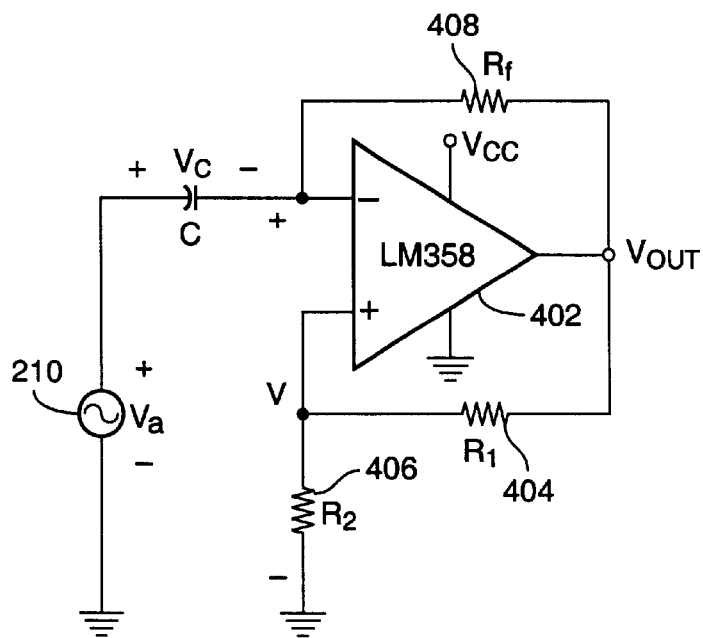
FIGS. 4–6 show typical circuit configurations in accordance with the invention.

An example of a circuit that exhibits an S-shaped transfer function is an operation amplifier (op-amp) configured with a feedback resistor between the op-amp output and its non-inverting input. FIG. 4 shows such a circuit. An op-amp 402 includes a positive feedback path where the op-amp's output feeds back to its non-inverting input. A typical off-the-shelf op-amp can be used, such as the LM-358 op-amp. Another example is a device commonly referred to as a unijunction transistor.

Figure 5:
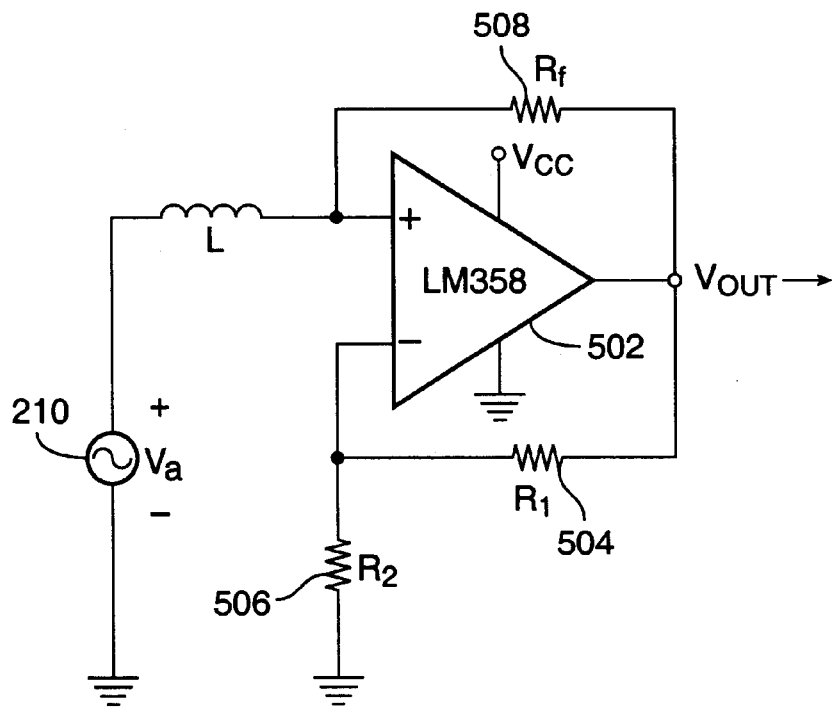

A circuit having an N-shaped transfer function can be realized using an op-amp with a feedback resistor connecting the op-amp output to its inverting input. This configuration is shown in FIG. 5, where an op-amp 502 includes a feedback path to its inverting input via resistor 504.

Figure 6:
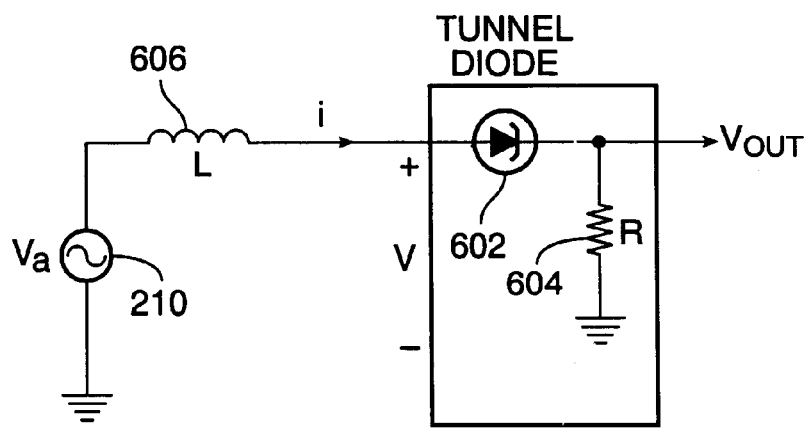

A further example of a circuit having an N-shaped transfer function is shown in FIG. 6. Here, a tunnel diode 602 is coupled to arbitrary analog waveform 210 through inductive element 606. The output $V_{out}$ is taken across resistor 604, which couples the other end of diode 602.

Figure 7:
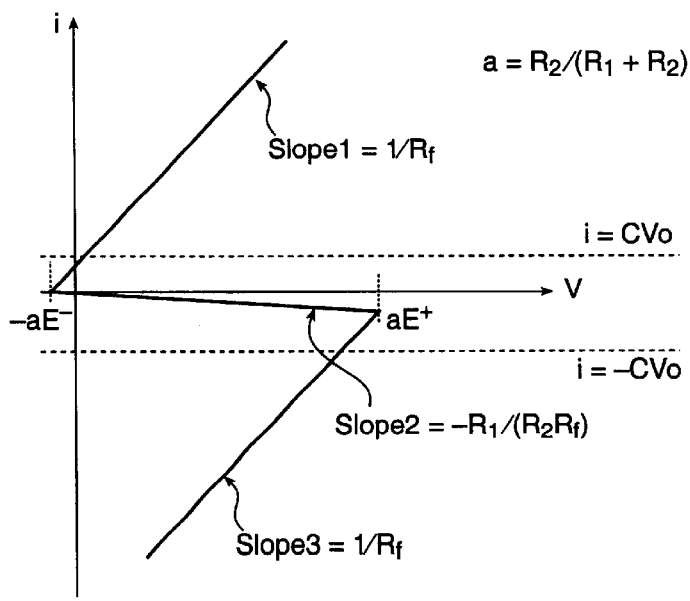
FIG. 7 explains the relationship of the operating point and the transfer function in connection with stable and unstable operation.

Refer back to the S-shaped transfer function of the circuit shown in FIG. 4. The relation of V and i is expressed as $V=\Psi(i)$ when the rate change of i is zero. $V_a$ is the arbitrary analog waveform. FIG. 7 shows the transfer function of the circuit shown in FIG. 4. The output saturation voltage of op-amp 402 is proportional to $E^+$ when the differential voltage ($V^+-V^-$) is greater than zero. Conversely, the output saturation voltage is proportional to $E^-$ when the differential voltage is less than zero.

The equations relating voltages $V_a$, $V_c$, V, and current i are:

$$V_a = V_c + V \quad (1)$$

$$\frac{dV}{dt} = \frac{dV_a}{dt} - \frac{i}{C} \quad (2)$$

$$\lim_{L\to 0} L\frac{di}{dt} = V - \Psi(i) \quad (3)$$

where L is a parasitic inductance which could be present in the form a a wire lead of a component.

The circuit of FIG. 4 has operating points of importance along the transfer function curve. These operating points are found by setting $dV/dt=0$ in Eqn. 2 and $di/dt=0$ in Eq. 3. As described above, $di/dt=0$ when $V=\Psi(i)$. To simplify the analysis, assume that $V_a$ is triangular waveform source. The time derivative of this waveform source is equal to $\pm V_0$ where $V_0$ is a constant. Hence, the operating points occur at the intersection of $i=+CV_0$ and the piecewise linear function of the transfer function and at the intersection of $i=-CV_0$ and the piecewise linear function. If the operating point lies on either of the positive slope lines slope 1 or slope 3 as shown in FIG. 7 (i.e., the stable regions), the output of the circuit is non-oscillatory. However, if the operating point lies on the negative slope line slope 2, namely, the unstable region, a continuous "jumping" phenomenon will occur. In the time domain, this is seen as a series of oscillations at the output of the circuit. In other words, the operating points along slope 1 and slope 3 are stable operating points. On the other hand, the operating points along slope 2 are unstable operating points. For the transfer function shown in FIG. 7, slope 2 can only intersect with line $i=-CV_o$. This means that oscillations will be observed only when $dV_a/dt$ is negative.

When $dV_a/dt$ is positive, no oscillatory activity is observed. By changing the negative slope of the arbitrary analog signal, the operating points can be moved ("forced") between the unstable and stable regions. This action produces periods of oscillatory and non-oscillatory behavior. Thus, for circuits having an S-shaped transfer function curve, it is the changing slope of the applied analog waveform that "forces" the circuit's operating point between stable and unstable region. By comparison, referring to FIGS. 9A and 9B for the moment, it can be seen that circuits having an N-shaped transfer curve operate by varying the amplitude of the applied analog waveform.

Figure 8:
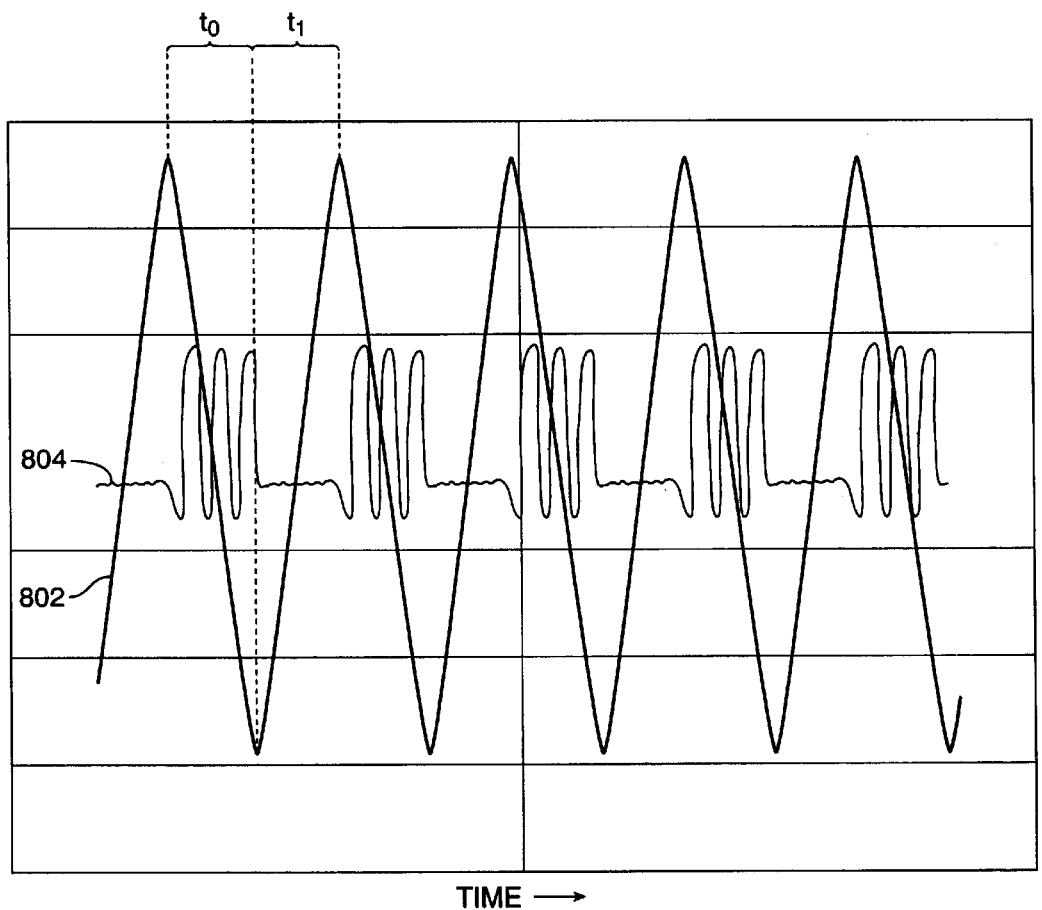
FIG. 8 are measurements taken from a prototype of the invention.

A prototype of the circuit shown in FIG. 4 was built and tested to confirm the foregoing principles. The arbitrary analog signal in this case was a 1 kHz triangular waveform 802. The amplitude of the waveform was 250 mV. $R_f$=1 k$\Omega$, $R_1$=10 $\Omega$, and $R_2$=100 $\Omega$. A 10 nF capacitor was used. The op-amp was biased at Vcc=1.5 V. The plot of FIG. 8 includes the arbitrary signal $V_a$ superimposed over a time response graph of the output 804 of the op-amp. As can be seen, the op-amp output is non-oscillatory when the slope ($dV_a/dt$) of the arbitrary analog signal $V_a$ is positive, during time period $t_1$ for example. As expected, at another time period $t_0$, oscillations occur only when $dV_a/dt$ is negative.

Figure 9A:
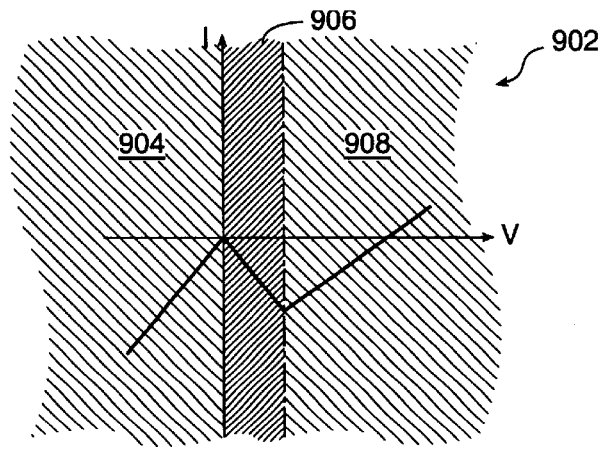
FIGS. 9A and 9B illustrate the information carrying capability of the technique in accordance with the invention.
Figure 9B:
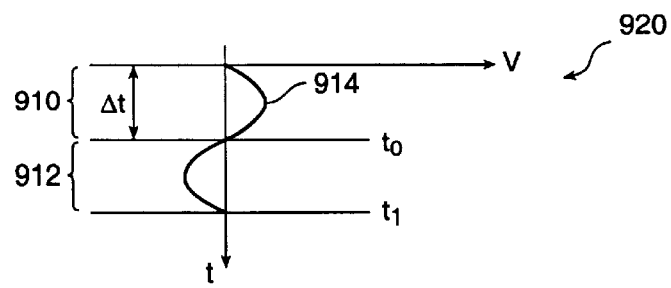

Referring now to FIGS. 9A and 9B, the discussion turns to an explanation of how arbitrary analog waveforms can be used to carry information for N-shaped transfer function curves. Recall that an arbitrary waveform can be applied to a circuit having the foregoing transfer function in a way that produces oscillatory or non-oscillatory behavior at its output. Consider the arbitrary waveform (in this case a sinusoid) 920. For illustrative purposes to facilitate the discussion, the timescale is shown on the vertical axis, which allows the voltage axis to be aligned with the transfer function 902.

For such circuits, the voltage amplitude of the applied analog signal is the "forcing" agent which moves the operating point of the circuit into the circuit's stable regions 904, 908 and unstable region 906. During time interval $0<t<t_0$, the amplitude of waveform 920 "forces" the operating point of the circuit into the unstable region 906. More specifically, the operating point lies along that portion of the transfer function 902 that lies in region 906. Consequently, the output of the circuit will exhibit oscillatory behavior. During time interval $t_0<t<t_1$, the waveform "forces" the operating point along the portion of the transfer function that lies, in this case, in region 904, where the output of the circuit is non-oscillatory. However, it is noted that waveform 920 could have been shaped differently so that the operating point is forced into region 908.

During the time that waveform 920 is in region 910, a certain number of oscillations will have been produced. These oscillations can be counted. Any of a variety of methods can be used for counting, since pulse counting is known in the relevant arts. For example, a zero-crossing technique can be used. This number of oscillations represents information, and hence region 910 can be referred to as a first information region of waveform 920. The region 912 of the waveform can be used, by convention, to separate the information region 910 of one waveform from the information region of the next waveform. In this respect, region 912 can be referred to as a second information region. It can be seen that waveform 920 could be shaped so that the second information region 912 of waveform precedes the information region 910 of the waveform. The important aspect is that the operating point alternate between the unstable region 906 of transfer function 902 during a first time duration and one of the stable regions 904, 906 of the transfer function during a second time duration.

A property of the unstable region of the transfer function is that the number of oscillations varies depending on the duration of time the operating point is kept in that region. Thus, the longer the operating point remains in the unstable region the greater the number of oscillations. Another property of the unstable region is that the number of oscillations varies depending on where the operating point is along the unstable portion of the transfer function. Consequently, the number of oscillations can be made a function of both duration in the unstable region and location of the operating point in the unstable region.

Figure 10:
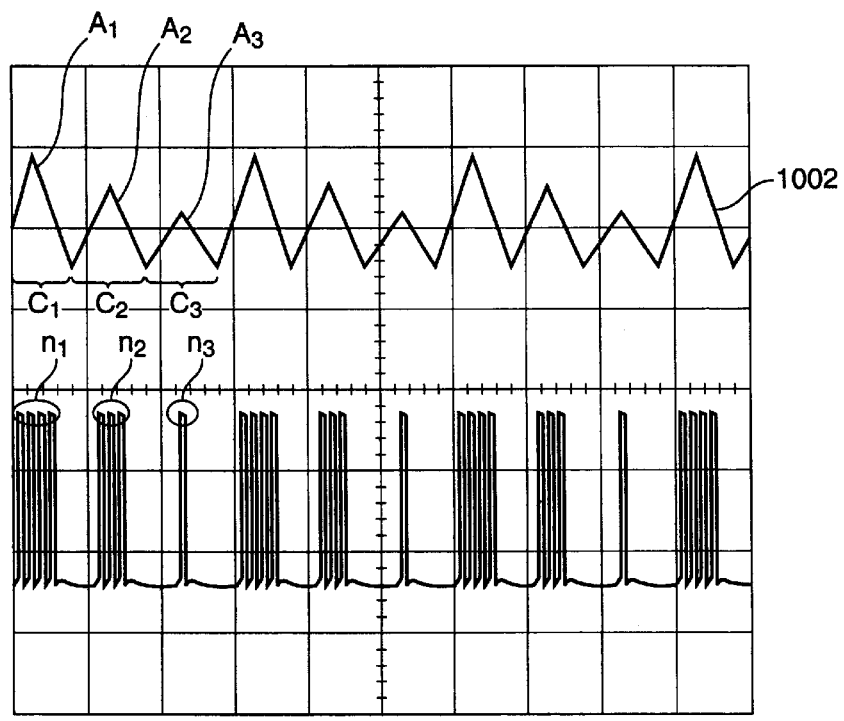
FIGS. 10–14 exemplify the variety of analog waveforms which can be used in connection with the method of the invention.

From the foregoing, it can be seen that the information region 910 of an analog waveform can be appropriately "shaped" to produce a given number of oscillations by adjusting either its time span Δt or its shape 914, or a combination of both. Thus in FIG. 10, a triangular waveform 1002 can be appropriately moduluated to produce any of three peak values $A_1$ (cycle $c_1$), $A_2$ (cycle $c_2$), and $A_3$ (cycle $c_3$). Each peak produces a corresponding number of oscillations, $n_1$, $n_2$, and $n_3$. As can be seen, this forms the basis for a three-symbol alphabet. Information can be sent by generating a multi-cycle waveform of triangular waves, each having an appropriate peak value.

Figure 11:
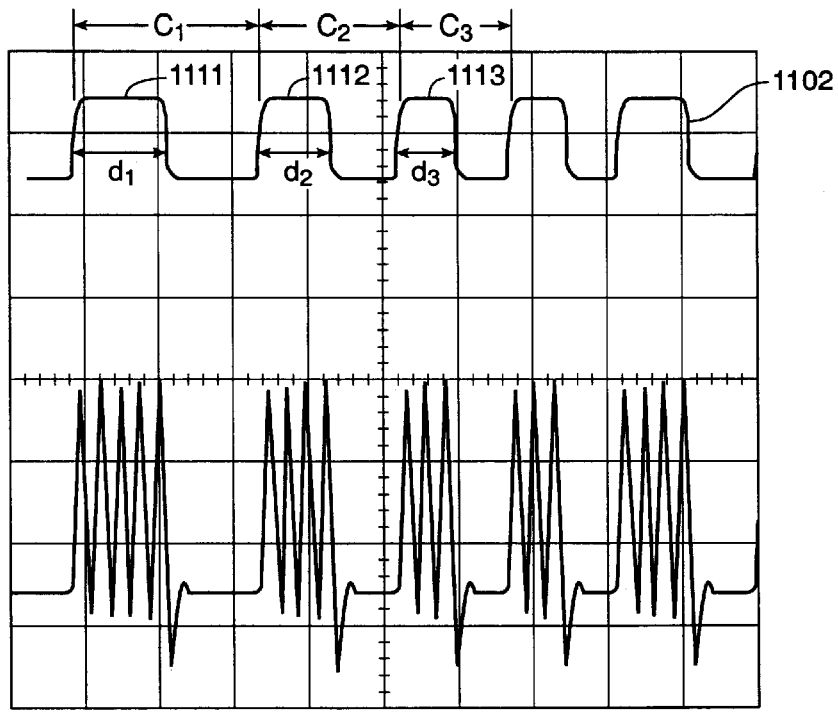

FIG. 11 shows a configuration where a pulse-like waveform 1102 is modulated. Here, the duration of the waveform can be used to produce a desired number of oscillations. For example, in cycle $c_l$, the information region 1111 has a duration $d_1$ which produces a first number $n_1$ of oscillations. In cycle $c_2$, the information region 1112 has a duration $d_2<d_1$ and thus produces a second number $n_2 \neq n_1$ of oscillations. Finally, in cycle $c_3$, the information region 1113 has a duration $d_3<d_2$ to produce yet a third number of oscillations.

Figure 12:
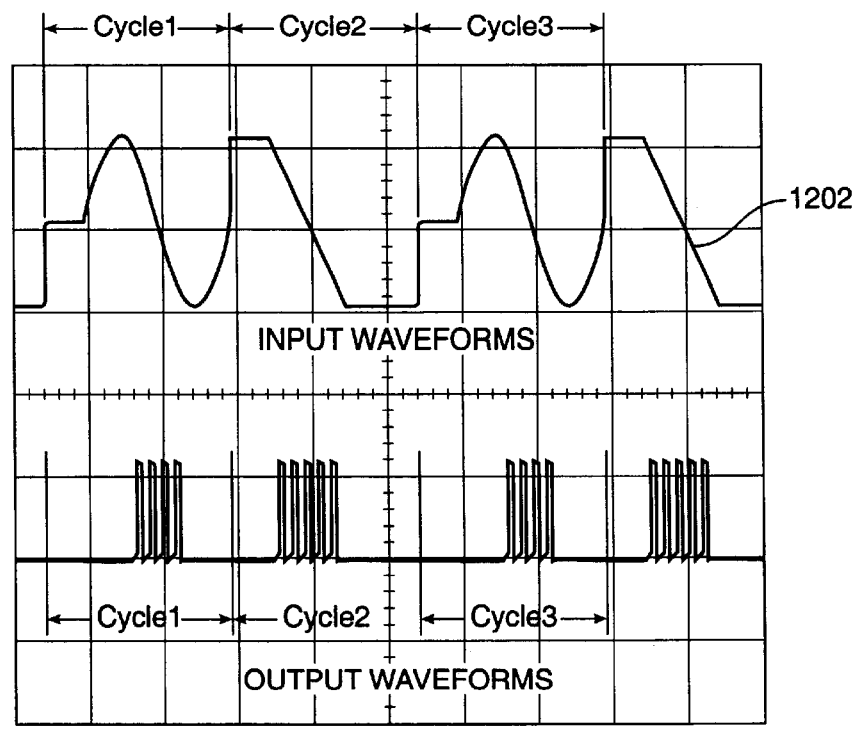
Figure 13:
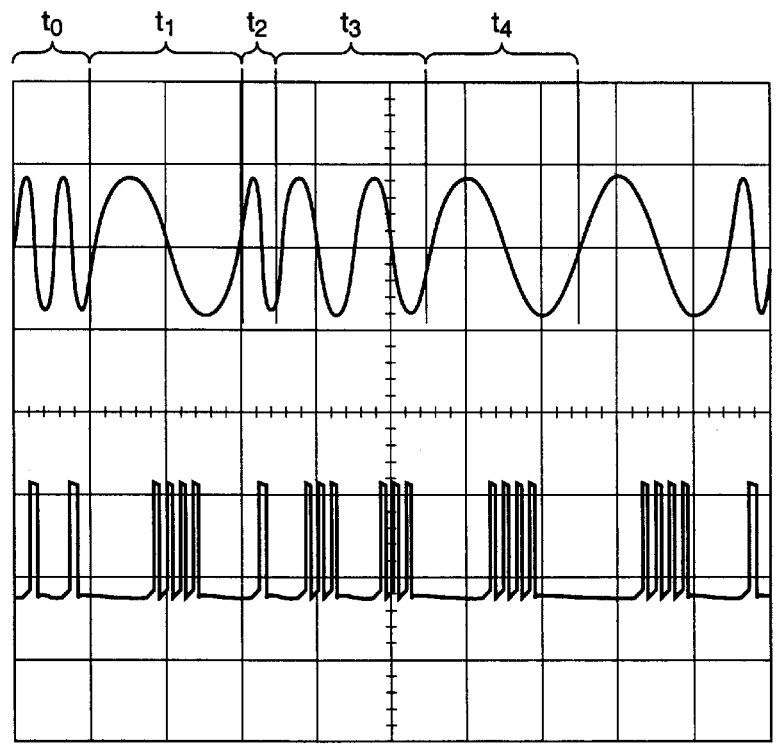
Figure 14:
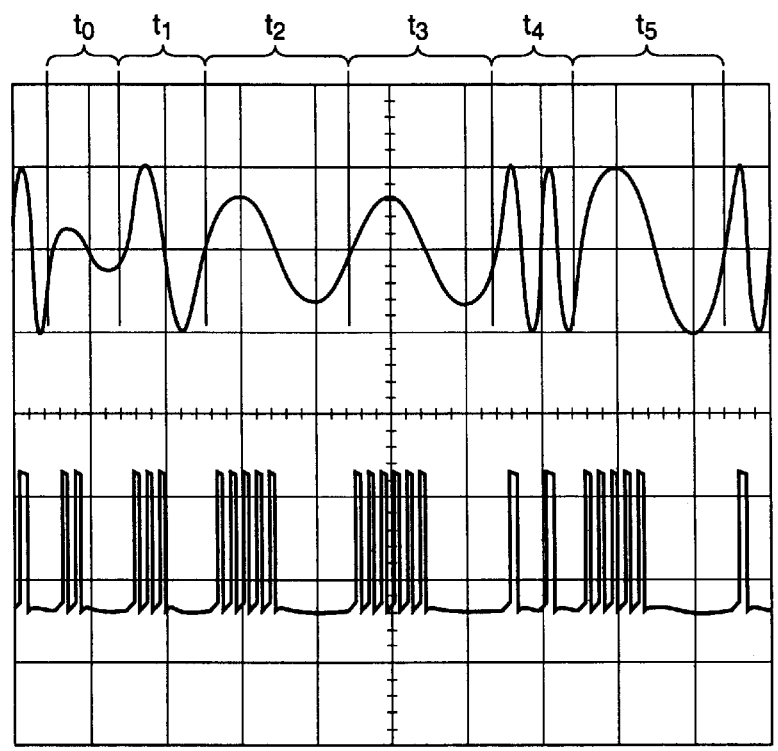

In the most general case, the kind of waveform can vary form one cycle to the next. Thus, in a first cycle, the waveform may be sinusoidal. The very next waveform can be a square wave. This configuration is shown in FIG. 12. In cycle 1, a waveform 1202 comprises a sinusoidal waveform which correlates with a certain number of oscillations. The number of oscillations will depend on factors such as amplitude of the information region of the waveform, which dictates where along the transfer function in the unstable region the operating point is located and/or the duration of the information region, which dictates how long the operating point stays in the unstable region. In cycle 2, the waveform 1202 takes the form of a ramp, which is followed by another sinusoid in cycle 3. FIG. 13 shows a configuration in which the frequency of a sinusoid is varied to produce correspondingly varying oscillatory output. FIG. 14 shows a configuration in which both the frequency and amplitude of a sinusoidal analog waveform are varied.

Extrapolating from the foregoing discussion, it can be seen that any arbitrary combination of waveforms is possible. It is only required that there be a corresponding circuit which has stable regions and an unstable region as described above, whose operating point can be selectively forced between the unstable and stable regions. In practice of course, appropriate channel-optimized waveforms would be selected to represent symbols for transmission. At the receiving end, the received transmission is fed into the input of a circuit as described above. The transmitted information can then be extracted from the resulting oscillatory and non-oscillatory behavior of the circuit. The advantage lies in the ability to select some arbitrary combination of arbitrary analog waveforms to represent information. Such information can then be transmitted by selecting waveforms which are appropriate for transmission by conventional methods. Hence, any conventional transmission medium, wireless or wired, can be used with the invention.

This invention has been explained with reference to specific embodiments. Other embodiments will be evident to those of ordinary skill in the art. It is therefore not intended that this invention be limited except as indicated by the appended claims.

What is claimed is:

1. A method for generating pulses from analog waveforms comprising:

exciting, with a known but arbitrary analog waveform, a circuit with a variable operating point and having a transfer function characterized by an unstable operating region bounded by a first stable operating region and a second stable operating region, wherein said analog waveform has a first information region and a second information region;

responsive to sensing of said first information region, forcing said variable operating point to vary in order to initiate operation of said circuit in said unstable operating region to produce at least one oscillation, said oscillation having a frequency greater than the rate of change of said operating point; and responsive to sensing of said second information region, forcing said variable operating point to vary into either one of said stable operating regions in order to terminate said at least one oscillation without transients;

wherein said initiating and said terminating alternate.

2. The method according to claim 1, wherein said analog waveform is cyclical.

3. The method of claim 1, wherein said analog waveform is selected from the group consisting of sinusoidal, ramp, asymmetric, sawtooth, square and channel-optimized symbol.

4. The method according to claim 1, wherein said analog waveform is cyclical and wherein said cycles comprise mixtures of different waveform types, including time-varying channel-optimized symbols.

5. The method according to claim 1 wherein said at least one oscillation has a peak to peak amplitude of at least zero to a maximum value relative to non-oscillation.

6. The method according to claim 1 wherein said circuit includes a negative impedance element, wherein said unstable operating region is a negative impedance region, and wherein said operating point is forced into said unstable region by a time varying input signal.

7. The method according to claim 1 wherein said circuit includes an operational amplifier circuit with feedback, and having series input through a capacitor, wherein said unstable operating region is a negative resistance region, and wherein said operating point is forced into said unstable region by a changing voltage applied to said capacitor.

8. The method according to claim 1 wherein said circuit includes a negative impedance element, and having series input through an inductor, wherein said unstable operating region is a negative impedance region, and wherein said operating point is forced into said unstable region by a changing current applied through said inductor.

9. The method according to claim 1 wherein said circuit includes a tunnel diode element, and having series input through an inductor, wherein said unstable operating region is a negative impedance region, and wherein said operating point is forced into said unstable region by a changing current applied through said inductor.

10. A decoding system for generating pulses from analog waveforms comprising:

means for receiving a known but arbitrary analog waveform, each said analog waveform having a first information region and a second information region;

a circuit with a variable operating point and having a transfer function characterized by an unstable operating region bounded by first stable operating region and a second stable operating region;

said circuit being responsive to sensing of said first information region to force said variable operating point to vary in order to initiate operation of said circuit in said unstable operating region to produce at least one oscillation, said oscillation having a frequency greater than rate of change of said operating point; and said circuit being further responsive to sensing of said second information region to force said variable operating point to vary into either one of said stable operating regions in order to terminate said at least one oscillation without transients, and wherein said initiating and said terminating alternate.

11. The system according to claim 10, wherein said analog waveform is cyclical.

12. The system of claim 10, wherein said analog waveform is selected from the group consisting of sinusoidal, ramp, asymmetric, sawtooth, square and channel-optimized symbol.

13. The system according to claim 10, wherein said analog waveform is cyclical and wherein said cycles comprise mixtures of different waveform types, including time-varying channel-optimized symbols.

14. The system according to claim 10 wherein said at least one oscillation has a peak to peak amplitude of at least zero to a maximum relative to non-oscillation.

15. The system according to claim 10 wherein said circuit includes a negative impedance element, wherein said unstable operating region is a negative impedance region, and wherein said operating point is forced into said unstable region by a time varying input signal.

16. The system according to claim 10 wherein said circuit includes an operational amplifier circuit with feedback, and having series input through a capacitor, wherein said unstable operating region is a negative resistance region, and wherein said operating point is forced into said unstable region by a changing voltage applied to said capacitor.

17. The system according to claim 10 wherein said circuit includes a negative impedance element, and having series input through an inductor, wherein said unstable operating region is a negative impedance region, and wherein said operating point is forced into said unstable region by a changing current applied through said inductor.

18. The system according to claim 10 wherein said circuit includes a tunnel diode element, and having series input through an inductor, wherein said unstable operating region is a negative impedance region, and wherein said operating point is forced into said unstable region by a changing current applied through said inductor.

\* \* \* \* \*